United States Patent [19]

Kubotera et al.

[11] 4,283,478

[45] Aug. 11, 1981

[54] LIGHT-SENSITIVE MATERIAL FOR PREPARING A LITHOGRAPHIC PRINTING PLATE AND A PROCESS USING THE SAME

[75] Inventors: Kikuo Kubotera; Akira Kashiwabara, both of Asaka, Japan

[73] Assignee: Fuji Photo Film Co., Ltd., Minami-ashigara, Japan

[21] Appl. No.: 39,479

[22] Filed: May 16, 1979

[30] Foreign Application Priority Data

May 19, 1978 [JP] Japan .................................. 53/59796

[51] Int. Cl.$^3$ .......................... G03C 5/00; G03C 1/52
[52] U.S. Cl. .................................... 430/156; 430/306
[58] Field of Search ............... 430/156, 165, 166, 325, 430/306, 273, 502, 505, 509, 302

[56] References Cited

U.S. PATENT DOCUMENTS

| | | | |
|---|---|---|---|
| 2,702,243 | 2/1955 | Schmidt | 430/156 |
| 3,146,104 | 8/1964 | Yackel et al. | 430/302 |
| 3,300,307 | 1/1967 | Smith | 430/325 |
| 3,453,109 | 7/1969 | Lee | 430/325 |
| 3,511,661 | 5/1970 | Rauner et al. | 430/302 |
| 3,567,445 | 3/1971 | Atkinson et al. | 430/156 |
| 3,576,634 | 4/1971 | Woodward et al. | 430/302 |
| 3,578,451 | 5/1971 | Doggett | 430/302 |
| 3,661,573 | 5/1972 | Laridon et al. | 430/306 |
| 3,723,119 | 3/1973 | Yoshida et al. | 430/302 |
| 3,759,711 | 9/1973 | Rauner et al. | 430/325 |

OTHER PUBLICATIONS

Kenyon, et al., Application Ser. No. 852,460 filed Aug. 22, 1969 as noted at 870 O.G. 1064 p. No. 6, P. 6.

*Primary Examiner*—Won H. Louie, Jr.
*Attorney, Agent, or Firm*—Sughrue, Mion, Zinn, Macpeak and Seas

[57] ABSTRACT

A light-sensitive lithographic printing plate forming material comprising a support having a hydrophilic surface provided in order with a layer of a positive-working light-sensitive resin composition capable of forming an oleophilic image, and a tannable light-sensitive silver halide emulsion layer containing a tanning-developing agent, and a process for preparing a lithographic printing plate using the same is disclosed.

23 Claims, No Drawings

LIGHT-SENSITIVE MATERIAL FOR PREPARING A LITHOGRAPHIC PRINTING PLATE AND A PROCESS USING THE SAME

BACKGROUND OF THE INVENTION

1. Field of the Invention

This invention relates to a light-sensitive material for preparing a lithographic printing plate and a process using the same and, more particularly, to a light-sensitive material for preparing a lithographic printing plate containing both a light-sensitive silver halide layer and a layer of a positive-working light-sensitive resin composition and having high sensitivity and camera speed, and a process for processing the same.

2. Discussion of the Prior Art

The term "camera speed" indicates that the light-sensitive material in question is photographically sensitive enough to permit imagewise exposure by focusing an original onto the light-sensitive layer of the printing plate forming material through an image-focusing lens system. On the other hand, the term "contact speed" means that a light-sensitive material has sensitivity such that it can be exposed through a negative or positive transparency placed in contact with it.

Most light-sensitive lithographic printing plate materials presently in commercial use are of contact speed sensitivity. Thus, an image-bearing transparency of the original must be prepared before a printing plate can be made from a contact speed material and the number of steps necessary to prepare the lithographic printing plates is considerably more than in the case in which no transparency is necessary.

The sensitizers typically used in light-sensitive lithographic printing plate materials are diazo compounds, o-quinonediazide compounds, or light-sensitive polymers like polyvinyl cinnamates. However, the photographic speed of these materials is too slow for the materials sensitized therewith to be of camera speed. Therefore, most light-sensitive lithographic printing plate making materials are of contact speed as previously described. The most common sensitizer used in photographic materials of camera speed is silver halide, and light-sensitive lithographic printing plate materials having solely a silver halide emulsion layer as the image-forming layer have been produced. However, such plate materials are comparatively difficult to process and the printing life thereof is not long, i.e., the number of prints which can be printed with them is not very great.

Other light-sensitive lithographic printing plate materials of camera speed are known. These materials are composite materials comprising a support having provided thereon a light-sensitive layer of contact speed and further a silver halide emulsion layer of camera speed. Examples are described in U.S. Pat. No. 3,567,445, Japanese Patent Application (OPI) No. 62501/77 (The term "OPI" as used herein refers to a "published unexamined Japanese patent application") (corresponding to U.S. Application Ser. No. 899,680, filed Apr. 24, 1978), U.S. Defensive Publication No. T 870,022, U.S. Pat. No. 3,578,451, etc.

In these composite light-sensitive lithographic printing plate materials, the light-sensitive layer of contact speed is oleophilic, and hence it is necessary to provide an interlayer or undercoating having good adhesion to both the hydrophilic silver halide emulsion layer and the oleophilic light-sensitive layer between them as described in British Pat. No. 1,187,980 and U.S. Pat. No. 3,567,445. Japanese Patent Publication No. 13128/65 describes a material without an interlayer for improving adhesion, but it is well known in this field that such materials are not practical since the silver halide emulsion layer peels from the oleophilic surface upon development processing the emulsion layer.

Japanese Patent Application (OPI) No. 62501/77 discloses that light-sensitive compositions prepared by dispersing silver halide grains coated with a hydrophilic polymer in an oleophilic polymer dissolved in an organic solvent provide light-sensitive lithographic printing plate materials having good adhesion when the silver halide emulsion layer is coated directly on a layer of an oleophilic light-sensitive composition of contact speed without an interlayer. However, in this process it is difficult to disperse the silver halide light-sensitive emulsion coated with the hydrophilic polymer in the organic solvent containing the oleophilic polymer and a deflocculant (e.g., salicyclic acid, acetic acid, etc.) for the hydrophilic polymer is necessary for dispersion. As a result, the workability of the process is extremely bad, for example, the hydrophilic polymer is often flocculated in a gel form upon preparation.

According to U.S. Pat. No. 3,567,445 composite light-sensitive lithographic printing plate materials are processed as follows. First, the silver halide emulsion layer is imagewise exposed, developed, fixed, and washed with water to form a silver image. Then, the light-sensitive layer of contact speed is exposed to ultraviolet rays through the silver image. After removing the silver halide emulsion layer, the light-sensitive layer of contact speed is developed. Thus, development processing of the silver halide light-sensitive layer is complicated and two additional steps of removing the light-sensitive layer of camera speed and developing the light-sensitive layer of contact speed are necessary.

Japanese Patent Application (OPI) No. 62501/77 describes removing the silver halide light-sensitive layer and developing the light-sensitive layer of contact speed in one step. That step is conducted by selecting an organic solvent which can be used to both develop the light-sensitive layer (dissolve the exposed portions in the case of a positive-working material or the unexposed portions in the case of a negative-working material) and remove the silver halide layer (dissolve the silver image portions). However, from a practical standpoint, it has been found that the use of such an organic solvent swells the image portions of the light-sensitive layer of contact speed and the strength of the image portions is reduced, resulting in deterioration of durability and image quality.

Example 8 of U.S. Pat. No. 3,511,661 describes a light-sensitive lithographic printing plate forming material comprising an aluminum support having an anodized aluminum oxide layer provided with a negative-working light-sensitive resin layer containing 4,4'-diazidostilbene and in contact therewith an unhardened gelatino silver chloride emulsion layer containing a tanning developing agent (3,4-dihydroxydiphenyl or 4-phenylcatechol). Also disclosed is a process of preparing a lithographic printing plate using this material by imagewise exposing it, dipping it into a sodium hydroxide aqueous solution to activate and conduct tanning development, spraying warm water (43° C.) on the plate to leave a hardened silver image relief on the light-sensitive resin layer, and drying. The thus developed plate is uniformly exposed to light, developed with benzyl alcohol to remove the hardened silver image relief and the underlying unexposed light-sensitive resin layer and leave only the exposure-hardened light-sensitive resin layer on the hydrophilic aluminum support. The plate is then subjected to desensitization processing, and used to print several thousand copies using the resultant lithographic printing plate. This material and processing are clearly different from that of the present invention in the following points: (i) the light-sensitive resin is negative-working; (ii) the material contains no tannable interlayer; (iii) no hardened silver image relief is formed on the developed light-sensitive resin layer and used in printing; and (iv) the light-sensitive resin layer developer is an alkali-free organic solvent. The number of printed copies is as small as several thousand, which is greatly smaller than the number of printed copies (about 100,000 to 150,000) attained in the present invention.

U.S. Defensive Publication No. T 870,022 describes a composite light-sensitive lithographic material comprising a support having a hydrophilic surface provided thereon, in order, with (a) a layer containing light-sensitive organic soluble polymer, (b) an interlayer such as a gelatin-cellulose nitrate undercoating or a gelatin-sodium silicate undercoating, and (c) a light-sensitive emulsion layer such as a silver halide emulsion layer. This material is clearly different from the light-sensitive material of the present invention in the following regards. First, the interlayer tends to delaminate from light-sensitive layer (a) in the presence of organic processing chemicals. Second, the tannable interlayer in the invention material may contain both a tanning developing agent and silver halide which makes it clearly different from the above-described interlayer (b).

U.S. Pat. No. 3,578,451 describes a composite light-sensitive lithographic plate forming material wherein an intermediate water-barrier coating and a silver halide emulsion layer are provided on a negative-working light-sensitive lithographic plate material. This is clearly different from the material and process of the present invention in that the light-sensitive layer is negative-working, n-propanol is used for developing the light-sensitive resin layer, and the entire silver halide emulsion layer is removed by the development with n-propanol. In addition, the number of printed copies is as small as about 10,000.

Extensive investigations directed to overcoming the above-described defects of conventional lithographic printing plate forming materials of camera speed have resulted in the discovery that strong adhesion is attained between a silver image and a light-sensitive layer of contact speed by imagewise exposing a composite light-sensitive lithographic printing plate forming material comprising a tannable interlayer containing the same polymer as the binder polymer of the light-sensitive silver halide emulsion layer, and a light-sensitive silver halide emulsion layer containing a tanning developing agent, and conducting tanning development through alkaliactivation processing which is a preferred embodiment.

SUMMARY OF THE INVENTION

One object of the present invention is to provide a highly sensitive light-sensitive lithographic printing plate forming material of camera speed without the aforesaid defects, and a process for preparing a lithographic printing plate using the same.

Another object of the present invention is to provide a highly sensitive light-sensitive lithographic printing plate forming material of camera speed, which can be easily processed.

A further object of the present invention is to provide a simple process for preparing a printing plate from a highly sensitive light-sensitive material of camera speed.

Still a further object of the present invention is to provide a highly sensitive lithographic light-sensitive printing plate forming material of camera speed having an extremely high durability.

Thus, the present invention provides:

A light-sensitive lithographic printing plate forming material comprising a support having a hydrophilic surface provided in order with a layer of positive-working light-sensitive resin composition capable of forming an oleophilic image, a tannable interlayer containing preferably the binder polymer in the silver halide emulsion layer hereinafter described, and a tannable light-sensitive silver halide emulsion layer containing a tanning developing agent;

a light-sensitive lithographic printing plate forming material as described above, wherein the interlayer contains a tannable silver halide emulsion containing a tanning developing agent and silver halide where the silver halide is present in the interlayer in amounts less than in the light-sensitive silver halide emulsion layer;

a process for preparing a lithographic printing plate using the aforesaid light-sensitive lithographic printing plate forming material comprising (i) imagewise exposing the light-sensitive silver halide emulsion layer in an amount such that a silver image is formed in the silver halide light-sensitive emulsion layer by subsequent activation processing using an alkali solution, (ii) forming a tanned silver image by activation processing using an alkali solution, (iii) washing off the unexposed portions of the light-sensitive silver halide emulsion layer and the interlayer leaving a tanned and hardened silver image portion and underlying interlayer on the positive-working light-sensitive resin layer, (iv) uniformly irradiating the material so processed with light to which the light-sensitive resin composition is sensitive in an amount such that the exposed portions of the layer of the light-sensitive resin composition dissolve in an alkaline developer, and (v) developing the material with an alkaline developer capable of dissolving the light-sensitive resin composition layer in areas where the relief image does not exist to thereby form a relief image comprising the unexposed portions of the light-sensitive resin composition layer and the tanned silver image; and a process for preparing a lithographic printing plate as described above, wherein the alkaline developer is the same alkali solution used for activating the light-sensitive silver halide emulsion layer.

In the present invention a tanning developing agent is incorporated in the light-sensitive silver halide emulsion layer (hereafter referred to as "silver halide layer") and strong adhesion is obtained between the tanning developed silver image portions and the layer of the positive-working light-sensitive resin composition (hereafter referred to as "light-sensitive resin layer"). The incorporation of a tanning developing agent in the silver halide layer enables the use of one alkaline solution to both activate the tanning developer (and thereby accomplish tanning development) of the silver halide emulsion layer and to dissolve away the exposed portions of the positive-working light-sensitive resin layer.

Thus, the number of developing baths in the plate-making process is reduced which facilitates processing.

Another feature of this invention is that the tanning-hardened silver image relief can be utilized as image areas of a lithographic printing plate without delamination. Complementary effects of the silver halide and light-sensitive resin layers are obtained, which remarkably improve the durability of the plate containing the silver image relief. Another feature is that strong adhesion is attained between the silver halide layer and the resin layer by providing a tannable interlayer containing at least the binder polymer of the silver halide layer therebetween.

The present invention will be described in more detail below.

DETAILED DESCRIPTION OF THE INVENTION

The support may be any of those supports that have a hydrophilic surface and are commonly used as supports in the manufacture of printing plates. Examples include hydrophilic metal plates (e.g., a grained aluminum plate, a grained and anodized aluminum plate, a zinc plate, a chromium plate, etc.); composite metal plates prepared by providing a thin layer of a hydrophilic metal like aluminum, zinc, or chromium on a metal plate like iron, copper, bronze, or stainless steel alloy; plastics films (e.g., polyethylene terephthalate, polycarbonate, cellulose nitrate, cellulose acetate, cellulose acetate butyrate, cellulose acetate propionate, polystyrene, polyethylene, polypropylene, etc.) having been processed to render the surface hydrophilic; papers impregnated or coated with the above-described plastics to render the surface hydrophilic; and papers.

The surface of the support can be rendered hydrophilic using any treatment well-known to those skilled in the art for the purpose. For example, suitable treatments include: hydrolysis with an alkali or acid, corona discharge, irradiation with ultraviolet rays, flame treatment, providing a hydrophilic subbing layer, etc.

The positive-working light-sensitive resin composition may be any light-sensitive composition that is sensitive to ultraviolet light and, when exposed to ultraviolet light, undergoes chemical reaction in the exposed areas, whereby the exposed areas become alkaline soluble. The layer of the light-sensitive resin composition is developed to remove the exposed portions, and then the insoluble unexposed portions form a positive image and remain on the support with the hydrophilic support surface being laid bare in the exposed areas. Since the resin layer itself is oleophilic, the image areas are also oleophilic.

Positive-working light-sensitive resin compositions which can be developed with an alkaline solution and which are particularly suitable for use in the present invention contain a light-sensitive material such as an o-quinonediazide. Representative examples include 1,2-naphthoquinonediazides such as 2,3,4-trihydroxybenzophenonebis(naphthoquinone-1,2-diazido-5,5-sulfonic acid ester) as described in Japanese Patent Publication No. 18015/62, 2-(naphthoquinone-1,2-diazido-5-sulfonyloxy)-1-hydroxy-7-naphthalene as described in Japanese Patent Publication No. 3627/62, naphthoquinone-1,2-diazido-5-sulfanilide as described in Japanese Patent Publication No. 1954/62, naphthoquinone-1,2-diazido-5-sulfonic acid novolak ester as described in Japanese Patent Publication No. 9610/70, etc. Commercially available positive-working light-sensitive resin compositions suitable for use in the present invention are KPR (type-3) (made by Eastman Kodak Co., U.S.A.); AZ-340, AZ-1350, AZ-111, AZ-119 (made by Azoplateshiply Co.); Photozol B, Photozol E (made by Tokyo Ooka Kogyo K.K.); FPPR-300, FPPR-700, EPPR-1000 (made by Fuji Yakuhin Kogyo K.K.); etc.

In addition to the naphthoquinonediazides, benzoquinonediazides such as benzoquinone-(1,2)-diazido-(2)-4-sulfonic acid phenyl ester, o,o'-bis[benzoquinone-(1'',2'')-diazido-(2'')-4''-sulfonyl]-4,4'-dihydroxybiphenyl, benzoquinone-(1,2)-diazido-(2)-4-(N-ethyl-N-$\beta$-naphthyl)sulfonamide, etc., are useful in the present invention.

In general, the compounds as described in Jaromir Kosar, *Light-Sensitive Systems*, Chap. 7.4, "o-Quinone Diazides", pp. 339–352 (1965), John Wiley and Sons, Inc., New York can be used as the o-quinonediazide compounds in the present invention.

The tannable interlayer serves to accelerate the development of the silver halide layer, increase adhesion between the oleophilic light-sensitive resin layer and tanned silver image portions of the silver halide layer, and improve the durability of the resulting printing plate. As a matter of course, the tannable interlayer is not essential when high durability is not required of the printing plates.

The tannable interlayer must strongly adhere to both the oleophilic surface of the light-sensitive resin layer and the tanned silver relief images formed by tanning development. Furthermore, it should readily dissolve in the wash-off step for removing non-image portions of the silver halide layer. Alternatively, the portions of the interlayer in the non-image areas should dissolve in the alkaline developer used for developing the light-sensitive resin layer.

In accordance with the present invention, the interlayer must be tanned together with the silver halide layer upon tanning development. The tanning developer per se need not be present in the interlayer as long as it diffuses into the interlayer to tan the interlayer upon development. The film-forming ingredient (binder) for the tannable interlayer may be selected from the tannable (or hardenable) polymers disclosed for the binder polymer in the silver halide emulsion layer may be used. Examples include: gelatin, gelatin derivatives (e.g., phthalated gelatin), polyacrylamides, etc.

As the binder polymer used for the tannable interlayer, the aforesaid polymers may be used alone or in combinations of two or more, with gelatin being particularly preferred. The interlayer is formed by directly dissolving the binder polymer in water, alkaline solution, organic solvent, or the like, or emulsifying the organic solvent solution thereof, coating the solution or dispersion on the light-sensitive resin layer in an ordinary manner, and drying it.

The dry thickness of the tannable interlayer usually ranges from about 0.1 to about 1.5$\mu$. Thicknesses thicker than are necessary should be avoided, because it deteriorates processability and reduces durability.

In the light-sensitive lithographic printing plate material of the present invention, the tannable interlayer is an essential element, and it is important to select the binder polymer to be used as a major ingredient of the interlayer, additives, amounts of silver halide and a tanning developing agent, and thickness of the interlayer with much care. The silver halide and tanning developing agents can each be incorporated in amounts of about 0.01 to 100 mmols, preferably about 0.1 to about 10 mmols, per 1 m² in area and 1μ dry thickness of the interlayer, and at all times less than the contents thereof in the silver halide layer. The tannable interlayer containing silver halide and/or a tanning developing agent may be the layer described in Japanese Patent Application (OPI) No. 10422/78 (corresponding to U.S. Patent Application Ser. No. 816,764, filed July 18, 1977) as an undercoating layer.

As the silver halide incorporated in the tannable interlayer, various silver halides may be used as is also the case with the silver halide in the silver halide emulsion layer discussed below. The size of silver halide grains is preferably less than the size of the silver halide grains incorporated in the silver halide layer.

Either surface latent image type emulsions or internal latent image type emulsions may be used. The internal latent image type emulsions are usually referred to as "autopositive emulsions".

The silver halide layer is prepared by incorporating a tanning developing agent in a conventional silver halide emulsion. As the silver halide, those usually used in silver halide photographic light-sensitive materials such as silver chloride, silver bromide, silver iodide, silver chlorobromide, silver bromoiodide, silver chlorobromoiodide, etc., may be used. The mean particle size of the silver halide grains is about 0.01 to 5μ, and preferably about 0.05 to about 2μ. Suitable hydrophilic colloids for the emulsion include gelatin, gelatin derivatives (e.g., phthalated gelatin), polymethacrylamide, polyvinyl alcohol, polyacrylic acid, etc. Gelatin or derivatives thereof exhibiting good tanning developability are particularly preferred.

Any silver halide emulsion containing a tanning developer and a tannable binder can be used as the silver halide layer in the present invention. Typical silver halide emulsions contain about 90 mol% or more silver bromide (preferably containing about 5 mol% or less silver iodide), contain silver halide grains of not more than about 0.1μ in mean particle size (a so-called Lippmann's emulsion), and have a silver halide/water-soluble binder (excluding water) ratio by weight of about 1:4 to about 8:1. Another example of a common emulsion contains about 90 mol% or more silver bromide (preferably containing about 5 mol% or less silver iodide), silver halide grains of not more than about 1μ in mean particle size, and a silver halide/water-soluble binder (excluding water) ratio by weight of about 1:6 to about 6:1. A further example is an emulsion which contains not less than about 50 mol% (preferably not less than about 70 mol%) silver chloride, silver halide grains of not more than about 1μ in mean particle size, and which has a silver halide/water-soluble binder (excluding water) by weight of about 1:6 to about 6:1.

It is essential that the tanning developing agent be incorporated in the silver halide layer, but it may also be incorporated in an adjacent layer (a tannable interlayer or an alkali-permeable resin layer). In tanning development, the hardening action varies depending upon the kind of the developing agent used. In the present invention, it is necessary to employ a tanning developing agent having particularly strong hardening action, and developing agents containing a benzene ring with two or more hydroxy groups are satisfactorily used.

As the tanning developing agents suitable for use in the present invention, there are mainly used polyhydroxybenzenes, in particular benzenes having hydroxy groups at least in the 1,2-positions or 1,4-positions of the benzene nucleus. Specific examples of the polyhydroxybenzenes include hydroquinone, catechol, chlorohydroquinone, pyrogallol, bromohydroquinone, isopropylhydroquinone, toluhydroquinone, methylhydroquinone, 2,3-dichlorohydroquinone, 2,5-dimethylhydroquinone, 2,3-dibromohydroquinone, 1,4-dihydroxy-2-acetophenone, 2,5-dimethylhydroquinone, 4-phenylcatechol, 4-t-butylcatechol, 4-n-butylpyrogallol, 4,5-dibromocatechol, 2,5-diethylhydroquinone, 2,5-benzoylaminohydroquinone, 4-benzyloxycatechol, 4-n-butoxycatechol, etc.

Of the above developers, pyrogallols and catechols are particularly preferred in view of their activity towards tanning development. Specifically, pyrogallol, 4-benzyloxycatechol, 4-n-butyloxycatechol, and 4-phenylcatechol are preferred.

The above-described tanning developing agents may be used in combination with other developing agents having no tanning properties. These non-tanning developers are generally used in amounts up to 35%, particularly up to 25% the amount of the tanning developer. Particularly preferred examples of other developing agents having no tanning properties are 3-pyrazolidones and aminophenols. Specific examples of 3-pyrazolidone compounds include 1-phenyl-3-pyrazolidone, 1-p-tolyl-3-pyrazolidone, 1-phenyl-4-methyl-3-pyrazolidone, 1-phenyl-4,4-dimethyl-3-pyrazolidone, and 1-p-chlorophenyl-3-pyrazolidone, and specific examples of aminophenol compounds include p-(methylamino)-phenol, p-aminophenol, 2,4-diaminophenol, p-(benzylamino)phenol, 2-methyl-4-aminophenol and 2-hydroxymethyl-4-aminophenol.

The tanning developing agent can be incorporated in the silver halide layer in an amount of about 0.01 to about 100 mmols, preferably about 0.1 to about 10 mmols, per 1μ in dry thickness of the light-sensitive layer and per 1 m² area. As has been stated before, the tanning developing agent is also added to the tannable interlayer in an amount more than in the silver halide layer, since there results a light-sensitive lithographic printing plate material with good preservability and a printing plate with good durability.

An oleophilic resin may be incorporated in the silver halide layer to increase the oleophilicity of the silver halide layer hardened by the tanning development and increase the mechanical or chemical strength of the relief image, thus serving to provide lithographic printing plates with good durability.

The resins which are added to the silver halide emulsion layer are added in particulate form. Typical examples are polymers or oligomers such as polyesters (e.g., polyethylene terephthalate, etc.), polyamides (e.g., nylon-6, etc.), phenolaldehyde resins, novolak type alkali-soluble phenol resins, polyvinyl chloride, polyurethane, epoxy resins, silicone resins, alkylphenol resins, ketone resins, alkyd resins, polyamines, polystyrene, polymethacrylic acid, methyl methacrylate/methacrylic acid copolymer, polyacrylates (e.g., polymethyl acrylate, polyethyl acrylate, etc.), rosin-modified maleic acid resin, rosin-modified fumaric acid resin, polyvinyl acetate, hydroxypropylmethyl cellulose, rosin-modified phenol resin, etc. Of these, polymers or oligomers of polystyrene, polyacrylates (e.g., polymethyl acrylate, polyethyl acrylate, etc.), polyvinyl acetate, polyurethane, hydroxypropylmethyl cellulose, novolak type alkali soluble phenol resin, methyl methacrylate/methacrylic acid copolymer, etc., are particularly preferred. These resins are usually used alone or in combinations of two or more and dispersed in the silver halide layer as a solution or a fine particle emulsion in an organic solvent. These resins are preferably used as fine particles of about 0.01 to about 5μ in mean particle size, and the shape of the particles is not particularly limited to a spherical form but may vary.

In order to incorporate the oleophilic resin fine particles in the silver halide emulsion, the oleophilic resin is first dissolved in an organic solvent, then the resultant solution is dispersed in an aqueous solution of a hydrophilic film-forming material to prepare an o/w dispersion, and this dispersion is added to the silver halide emulsion under stirring. The resin is added to the silver halide emulsion in an amount of about 0.1 to 5 parts by weight, particularly preferably 0.3 to 2 parts by weight, per 1 part by weight of the film-forming ingredient (e.g., gelatin) in the emulsion. The thickness of the emulsion layer is generally about 0.5 to about 10μ, preferably about 1 to about 6μ.

An alkali-permeable resin protective layer may be provided on the silver halide layer, if necessary. This protective layer must allow an alkali solution to enter from outside into the silver halide layer to effect development. Therefore, the alkali-permeable resin layer may be provided in various forms, for example, as fine particles of the resin uniformly or distributed (as islands) on the silver halide layer, or as a uniform thin film having a thickness that the alkali solution can permeate therethrough. Thus, the resin itself may be alkali solution-permeable or alkali solution-impermeable depending on how it is applied. The resin layer must remain on the image-forming layer after development of the light-sensitive layer, and to be substantially insoluble in water or an alkali solution.

Where the silver halide layer has a sufficient mechanical strength, the alkali permeable resin layer is naturally dispensable. However, since the non-image portions of the silver halide layer must be washed off, the silver halide layer is originally preferably hardened only slightly or rather not hardened, thus mechanical strength of the silver halide layer is generally somewhat low. Thus, it is preferable to provide the alkali permeable resin layer as a protective layer.

The resins used for the alkali permeable protective layer may be selected from the oleophilic resins described above which are added to the silver halide layer. This resin layer is formed by dissolving the selected resin in an organic solvent, or further emulsifying the resultant solution, and directly coating the solution or dispersion on the aforesaid silver halide layer, followed by drying. As an alternative method, fine particles of the resin prepared according to the processes described in Japanese Patent Publication Nos. 23406/72 (corresponding to U.S. Pat. No. 3,716,505), 51830/72 (corresponding to British Pat. No. 1,319,815), etc., may be similarly coated dispersed in an organic solvent to which a plasticizer may be added, if desired, and dried. The thus-formed resin layer is an extremely thin layer having a thickness of about 0.01 to about 5μ, preferably about 0.2 to about 2μ, or is distributed in an island-like fashion or exists in the form of accumulated fine particles and in any case permits an alkali solution to be fed from outside.

According to the process of the present invention, the silver halide layer of lithographic printing plate forming material described above is imagewise exposed, subjected to activation processing using an alkali solution, and the non-image areas of the silver halide layer are washed off. After drying (optional), the light-sensitive resin layer is exposed to ultraviolet rays, and the exposed portions of the positive-working layer are dissolved using an alkaline developer to leave a hardened relief image comprising the unexposed portions of the light-sensitive resin layer, the hardened silver relief, and the interlayer lying therebetween. The thus-formed relief image is used as a printing image.

In the step of imagewise exposure, light having passed through an original line image, halftone dot image, transparency with a continuous gradation, color photographic negative, etc., is transmitted to the light-sensitive lithographic printing plate material of the present invention. The original may be a positive or negative. It is also possible to imagewise expose by reflection printing using an original on an opaque support. Imagewise exposure may be carried out by contact printing, reflection printing, enlarging printing, or direct photographing of an original through a screen superposed on the original is possible. Light sources for the imagewise exposure, exposure amounts, imagewise exposing procedures, and the like may be employed as is known in the art of silver halide photography.

Subsequently, a tanning development is conducted through activation processing using an alkali solution. Tanning development is described, for example, in C. E. K. Mees, *The Theory of the Photographic Process*, 2nd Ed., pp. 580–584. A latent image formed by imagewise exposure of the silver halide grains in the light-sensitive layer is developed and the binder, e.g., gelatin around the grains, is hardened by the oxidation product of the tanning developer at the same time. The alkali solution used is an aqueous solution containing an alkali at a pH of about 9 to 14 at which the tanning development agent contained in the silver halide layer can maintain it developing activity. The silver halide in the silver halide layer is developed and the silver image portions of the emulsion layer are hardened through this processing. Useful alkaline materials are sodium hydroxide, potassium hydroxide, lithium hydroxide, sodium phosphate, potassium phosphate, lithium phosphate, sodium carbonate, potassium carbonate, ammonium carbonate, sodium bicarbonate, ammonia, etc. The pH of the solution is generally maintained at 9 to 14, preferably 9.5 to 13.5.

The activating solution may further contain, if necessary, antifogging agents. Potassium bromide is ordinarily used as the antifogging agent. Also, benzimidazole derivatives, nitroimidazoles, oxazoles, thiazoles, triazoles, tetrazoles, thioanilides, thioglycolic acids, etc., can be used. Further, additives ordinarily used for a photographic develper such as a surfactant, a water softener (e.g., sodium hexametaphosphate or ethylenediaminetetraacetic acid), an organic solvent, etc., may be added as conventionally required.

In the process of the present invention, tanning development can be conducted at an activation processing temperature of about 5° to 40° C., preferably about 20° to 35° C., and for a processing time of about 10 seconds to 10 minutes, preferably about 30 seconds to 3 minutes.

The light-sensitive lithographic printing plate material subjected to the above-described activation processing is then dipped (if desired after acidic stopping and fixing by a non-hardening fixing solution) in warm water of about 40° to about 70° C., and the surface is rubbed with a sponge or the like to remove the non-silver image portions of the silver halide layer and the underlying portions of the interlayer, thus a hardened relief silver image is formed. Where no interlayer exists, non-silver image portions of the light-sensitive resin layer are dissolved to form a hardened relief silver image. This is usually conducted by warm water processing called wash-off, which is well known in the art. The thus-processed material may be dried under suitable conditions, or may be subjected to further processing without drying. The surface of the material is then exposed for a short period of time using a light source emitting ultraviolet rays to expose the light-sensitive resin layer. The light-source, exposure amount, exposing procedures, and the like can be selected based on conventional techniques for preparing presensitized plates.

An alkaline developer may be used for development processing of the resin layer. It is an important feature of the present invention that development processing of the light-sensitive resin layer and development processing of the silver halide layer can be conducted using the same developer (alkali activation processing), which serves to simplify development. This advantage is obtained by dispersing the tanning development agent in the silver halide layer.

As the developer for the light-sensitive resin layer, there are illustrated alkaline developers containing lithium hydroxide, sodium hydroxide, potassium hydroxide, sodium carbonate, sodium silicate, sodium phosphate, etc. Of these, alkaline developers containing sodium carbonate, sodium silicate, sodium phosphate, etc., alone or in combination are particularly preferred.

The thus-developed lithographic printing plate material is dipped in running water, and the surface is lightly rubbed with, for example, a sponge or the like to dissolve away exposed portions of the light-sensitive resin layer, thus a lithographic printing plate is prepared. Additionally, it is extremely important to leave the hardened relief silver image which is useable directly as the image portion of the resultant printing plate. Thus, there can be obtained a lithographic printing plate having an extremely high durability.

It is possible to further strengthen the relief image on the plate by heating the plate surface to about 70° to about 300° C., irradiating it with infrared rays, or chemically treating it with a dichromate, peroxide, cobalt complex salt, epoxy compound, etc., after drying.

According to the present invention, known elements are adroitly combined to successfully improve durability of this type of light-sensitive lithographic printing plates.

Furthermore, since some of the elements of the present invention have already been developed in other techniques, such techniques can be directly applied in practicing the present invention. Thus, the present invention can be practiced with extreme ease. Light-sensitive lithographic printing plate materials containing a silver halide light-sensitive layer have been utilized only in light printing field due to their poor durability in spite of their excellently high sensitivity. However, the present invention provides extremely high durability with the merits of high sensitivity, and hence the resultant printing plates are satisfactorily used as a medium-run printing plate for printing 100,000 to 150,000 copies.

The present invention will now be described in more detail by the following examples and comparative examples which are not to be construed as limiting.

EXAMPLE 1

On a light-sensitive resin composition layer of a positive-working presensitized printing plate (a GAP plate made by Fuji Photo Film Co., Ltd.) was coated a tannable interlayer coating solution of the following formulation in a dry thickness of 0.5 g/m$^2$, and dried to provide a tannable interlayer.

| Formulation of Tannable Interlayer | | |
|---|---|---|
| 2 wt % gelatin aqueous solution | 45 | g |
| Silver bromoiodide emulsion (AgBr: 95 mol %; AgI: 5 mol %; mean particle size of AgBrI: 0.05 μ; Ag content: 0.5 mol/kg emulsion) | 45 | g |
| Water | 180 | ml |
| Propanol | 180 | ml |
| 4-Phenylcatechol | 3.8 | g |

Separately, a tannable gelatino silver bromochloride light-sensitive emulsion of the following formulation containing a tanning developing agent dispersion was prepared.

| Tanning Developing Agent Dispersion | |
|---|---|
| 4-Phenylcatechol | 3 g |
| Vinyl chloride (86 wt %)-vinyl acetate (13 wt %)-maleic anhydride (1 wt %) copolymer | 3 g |
| Tricresyl phosphate | 3 ml |
| Ethyl acetate | 12 ml |

The above-described ingredients were heated to dissolve them, and the resulting solution was added to 100 ml of a 50° C., 10 wt% gelatin aqueous solution containing 5 ml of a 10 wt% sodium alkylbenzenesulfonate aqueous solution and, while maintaining the temperature at 50° C., the mixture was subjected, 5 times, to an intermittent procedure comprising stirring at a high speed using a homoblender and stopping the stirring for 10 seconds. Thus, there was obtained a tanning developing agent dispersion.

Subsequently, the following ingredients were combined and the system was heated to 40° C. to dissolve, followed by stirring to prepare a uniform dispersion.

| Silver-Chlorobromide Emulsion | |
|---|---|
| Tanning developing agent emulsion dispersion | all |
| Gelatino silver chlorobromide emulsion (AgCl: 70 mol %; AgBr: 30 mol %; mean particle size of AgClBr: 0.3 μ; Ag content: 1 mol/kg emulsion) | 50 g |
| Water | 380 ml |
| 0.1 wt % methanol solution of 1,3-diethyl-5-{[3-(3-sulfopropyl)benzoxazol-2-ylidene]-ethylidene}thiohydantoin sodium salt | 5 ml |
| 0.5 wt % aqueous solution of 4-hydroxy-6-methyl-1,3,3a,7-tetrazaindene | 10 ml |
| 10 wt % aqueous solution of sodium benzenesulfonate | 3 ml |

To the thus-obtained dispersion was added 13.5 ml of a polyacrylic acid ester aqueous emulsion, HA-16 (solids: 46%; viscosity at 25° C.: 600 cps; made by Nippon Akuriru Kagaku K. K.) and stirred to obtain a uniform dispersion. Thus, there was obtained a tannable gelatino silver chlorobromide light-sensitive emulsion containing a tanning developing agent.

The thus-obtained gelatino silver chlorobromide light-sensitive emulsion was coated on the aforesaid tannable interlayer in a dry thickness of 4 g/m² using a rotary coating machine (110 rpm), and dried for 15 minutes at 30° C. to prepare the silver halide layer.

A protective layer composition solution having the following formulation was prepared.

| Protective Layer Composition | | |
|---|---|---|
| Vinyl chloride (86 wt %)-vinyl acetate (13 wt %)-maleic anhydride (1 wt %) copolymer | 0.2 | g |
| 1,2-Dichloroethane | 100 | ml |

The above-described solution was coated on the second silver halide layer in a dry thickness of 0.3 g/m², then dried. Thus, a light-sensitive lithographic printing plate material having a protective layer was completed.

The light-sensitive lithographic printing plate was imagewise exposed for 5 seconds using a mini-copy film having a negative image (negative image being a ¼-size original) and using an enlarging printer equipped with a xenon lamp (4 kw in output) with a lens diaphragm of F:11 at a 4-fold magnification (i.e., to make the size the same as that of the original).

Then, the material was subjected to activation processing at 32° C. for 1 minute using an alkaline solution of the following formulation to form a positive silver image and harden gelatin in the silver image portions.

| Alkaline Activating Solution | | |
|---|---|---|
| Anhydrous sodium carbonate | 110 | g |
| Potassium bromide | 1.5 | g |
| Sodium polymetaphosphate containing as a major component sodium hexametaphosphate ("Calgone", produced by Calgone Inc.) | 1.0 | g |
| Sodium silicate | 80 | g |
| Water to make | 1 | l |

The tanning-developed light-sensitive lithographic printing plate material was then dipped in water at about 40° C. and the surface was lightly rubbed by a sponge to dissolve away the non-image portions of the silver halide layer, thus a silver relief image was formed. Thereafter, about 40° C. warm air was directed to the material to dry, and the surface of the material was irradiated for 45 seconds using a 2 kw metal halide lamp (PS Light made by Fuji Photo Film Co., Ltd.) spaced at a distance of 1 m from the material. Then, the light-sensitive printing plate material was dipped at 25° C. for 1 minute in the alkaline activating solution having been used for developing the silver halide layer to develop. Exposed portions of the light-sensitive resin layer were removed by this processing to lay bare the surface of the aluminum support, whereas unexposed portions of the first light-sensitive resin layer, and interlayer, hardened relief silver image, and the protective layer lying thereon remained as such to provide image portions (positive images) of the lithographic printing plate.

The thus-prepared lithographic printing plate was mounted on a "Heidelbelg KOR" offset lithographic printing press, and offset lithographic printing was conducted using a commercially available oleophilic printing ink "F-Gloss 85 Black" (made by Dai Nippon Ink & Chemicals, Inc.) and a 32-fold diluted solution of a commercially available damping water ("#60", made by Fuji Photo Film Co., Ltd.) in a conventional manner to obtain 150,000 high quality prints.

This is an example of using the same alkaline aqueous solution for developing both the silver halide layer and the light-sensitive resin layer which greatly serves to simpify the process of preparing lithographic printing plates.

EXAMPLE 2

A 0.24 mm-thick aluminum plate was washed for 30 seconds with a 10 wt% sodium hydroxide aqueous solution (25° C.) to degrease it, then about a 10 volt A.C. current was allowed to flow through the plate for about 20 minutes in an about 1% hydrochloric acid solution (about 23° C. solution temperature). Then, the aluminum plate was immediately subjected to an anode oxidation processing for 5 minutes in 20 wt% dilute sulfuric acid at a current density of 1 A/dm², washed with water, and dried to prepare a hydrophilic aluminum plate having an aluminum oxide layer on the surface thereof.

This plate was used as a support on which was coated a positive-working light-sensitive resin layer of the following formulation in a dry amount of 3.0 g/m² using a rotary coating machine (200 rpm), then dried for 3 minutes at 100° C.

| Formulation of Light-Sensitive Resin Layer | |
|---|---|
| o-Quinonediazide | 8 g |
| m-Cresol type novolak resin | 13 g |
| 1,2-Dichloroethane | 100 ml |
| Methyl Cellosolve acetate | 50 ml |

Then, on this light-sensitive resin layer was provided a tannable interlayer in the same manner as in Example 1.

On this interlayer was coated, in turn, a silver halide layer prepared as below in a dry thickness of 4 g/m² using a rotary coating machine (110 rpm), then dried at 30° C. for 15 minutes to prepare a light-sensitive printing plate material of camera speed.

3 g of 4-phenylcatechol was dissolved in 12 ml of ethyl acetate by heating, and the resultant solution was added to 100 ml of a 10 wt% gelatin solution containing 5 ml of a 10 wt% sodium alkylbenzenesulfonate aqueous solution and, while maintaining the temperature at 50° C., the mixture was subjected, 5 times, to an intermittent procedure comprising stirring at a high speed using a homoblender and stopping the stirring for 10 seconds. Thus, there was obtained a tanning developing agent emulsion dipsersion. Subsequently, the following ingredients were combined.

| Silver-Chlorobromide Emulsion | |
|---|---|
| Tanning developing agent emulsion dispersion | all |
| Silver chlorobromide emulsion (AgCl: 70 mol %; AgBr: 30 mol %; mean particle size of AgClBr: 0.3μ; Ag content: 1 mol/kg emulsion) | 50 g |
| Water | 380 ml |
| 0.1 wt % methanol solution of 1,3-diethyl-5-{[3-(3-sulfopropyl)benzoxazol-2-ylidene]ethylidene}thiohydantoin sodium salt | 5 ml |
| 0.5 wt % aqueous solution of 4-hydroxy-6-methyl-1,3,3a,7-tetrazaindene | 10 ml |
| 10 wt % aqueous solution of sodium | 3 ml |

-continued

| Silver-Chlorobromide Emulsion | |
|---|---|
| benzenesulfonate | |

The whole system was heated to 40° C. to dissolve.

Plate-making and printing were conducted as follows using this highly sensitive light-sensitive lithographic printing plate material of camera speed.

After imagewise exposing in the same manner as in Example 1, the material was subjected to the tanning development using an alkaline activating solution of the following formulation at 25° C. for 1 minute to form a positive silver image and at the same time hardened gelatin in the silver image portions.

| Alkaline Activating Solution | | |
|---|---|---|
| Anhydrous sodium carbonate | 110 | g |
| Potassium bromide | 1.5 | g |
| Sodium polymetaphosphate containing sodium hexametaphosphate as a major component ("Calgone") | 1.0 | g |
| Water to make | 1 | l |

The tanning-developed light-sensitive printing plate material was then dipped in an about 40° C. warm water, and the surface was lightly rubbed with a sponge to remove the non-image portions of the silver halide layer, thus a relief image was formed. Thereafter, warm air at 40° C. was directed to the material to dry it, and the surface of this material was irradiated for 45 seconds using a 2 kw metal halide lamp (PS Light, made by Fuji Photo Film Co., Ltd.) spaced at a distance of 1 m. Then, the material was dipped for 1 minute at 25° C. in a developer having the following formulation. Exposed portions of the light-sensitive resin layer were removed by this processing to lay bare the surface of the aluminum support, whereas unexposed portions of the light-sensitive resin layer, and interlayer and hardened relief silver image lying thereon remained as such to provide image portions (positive images) of the lithographic printing plate.

| Developer Formulation | |
|---|---|
| Sodium silicate | 180 g |
| Water to make | 1 l |

Offset lithographic printing was conducted in the same manner as in Example 1 to obtain 150,000 high quality prints.

EXAMPLE 3

Example 1 was repeated except the tannable interlayer was omitted. 80,000 high quality prints were obtained. Examination of the lithographic printing plate at the stage of having printed 80,000 copies revealed that the plate was still in an almost perfect condition and printing could be further continued.

EXAMPLE 4

Example 2 was repeated except the tannable interlayer was omitted. 100,000 high quality prints were obtained. Examination of the lithographic printing plate after 100,000 copies revealed that the plate was still in an almost perfect condition and printing could be continued.

COMPARATIVE EXAMPLE 1

Example 1 was repeated except the tannable interlayer was omitted and the exposed portions of both the light-sensitive resin layer and the hardened silver relief image were removed by dipping the material in the developer and strongly rubbing the surface with a sponge. 70,000 prints were obtained.

COMPARATIVE EXAMPLE 2

Example 2 was repeated except the tannable interlayer was omitted and the exposed portions of both the lightsensitive resin layer and the hardened silver gelatin relief image were removed by dipping the material in the developer and strongly rubbing the surface with a sponge. 50,000 prints were obtained.

While the invention has been described in detail and with reference to specific embodiments thereof, it will be apparent to one skilled in the art that various changes and modifications can be made therein without departing from the spirit and scope thereof.

What is claimed is:

1. A light-sensitive lithographic printing plate forming material comprising a support having a hydrophilic surface provided in order with a layer of a positive-working light-sensitive resin composition which comprises an o-quinone diazide compound and which is capable of forming an oleophilic image, a tannable interlayer containing a tanning developing agent, which interlayer is a silver halide emulsion layer wherein the amounts of the tanning developing agent and the silver halide therein are 0.01 to 100 mmols and 0.01 to 10 mmols, respectively, per square meter of area and 1μ of dry thickness of the interlayer and a tannable second light-sensitive silver halide emulsion layer containing a tanning developing agent, wherein the tanning developing agent is present in the light-sensitive silver halide emulsion layer in an amount of about 0.01 to 100 mmols per 1μ thickness and square meter of the second silver halide emulsion layer, and wherein the amounts of tanning developing agent and silver halide in the interlayer are less than the amounts thereof in the light-sensitive silver halide emulsion layer.

2. A light-sensitive lithographic printing plate forming material comprising a support having a hydrophilic surface provided in order with a layer of a positive-working light-sensitive resin composition which comprises an o-quinone diazide compound and which is capable of forming an oleophilic image, a tannable interlayer containing a tanning developing agent, which interlayer is a silver halide emulsion layer, and a tannable silver halide light-sensitive emulsion layer containing a tanning developing agent wherein the tannable interlayer contains a polymer the same as the binder polymer in said silver halide emulsion layer wherein the amounts of the tanning developing agent and the silver halide therein are 0.01 to 100 mmols and 0.01 to 10 mmols, respectively, per square meter of area and 1μ of dry thickness of the interlayer, and wherein the amounts of tanning developing agent and silver halide in the interlayer are less than the amounts thereof in the light-sensitive silver halide emulsion layer.

3. The light-sensitive material of claims 1 or 2, wherein the tanning developing agent is a polyhydroxybenzene compound.

4. The light-sensitive material of claims 1 or 2, wherein an aminophenol or a 3-pyrazolidone developing agent is co-present with said tanning developing agent.

5. The light-sensitive material of claims 1 or 2, wherein the positive-working light-sensitive resin composition layer is sensitive to ultraviolet light.

6. The light-sensitive material of claim 5, wherein upon exposure of the positive-working light-sensitive resin composition layer to ultraviolet light, the exposed portions of the layer are rendered soluble in an aqueous alkaline solution.

7. The light-sensitive material of claim 1, wherein the o-quinonediazide is a naphthoquinonediazide or a benzoquinonediazide.

8. The light-sensitive material of claims 1 or 2, wherein the silver halide layer additionally contains an oleophilic resin in an amount of about 0.1 to 5 parts by weight per part by weight of film forming polymer in the silver halide layer.

9. The light-sensitive material of claims 1 or 2, additionally comprising an alkali permeable surface layer.

10. The light-sensitive material of claims 1 or 2, wherein the tanning developer is selected from the group consisting of pyrogallol, 4-benzyloxy catechol, 4-n-butyloxy catechol and 4-phenyl catechol.

11. A process of preparing a lithographic printing plate which comprises: (1) imagewise exposing a light-sensitive lithographic printing plate material comprising a support having a hydrophilic surface provided in order with a layer of a positive-working light-sensitive resin composition which comprises an o-quinone diazide compound and which is capable of forming an oleophilic image, a tannable interlayer containing a tanning developing agent, which interlayer is a silver halide emulsion layer wherein the amounts of the tanning developing agent and the silver halide therein are 0.01 to 100 mmols and 0.01 to 10 mmols, respectively, per square meter of area and $1\mu$ of dry thickness of the interlayer and a tannable light-sensitive silver halide emulsion layer containing a tannable developing agent such that a silver image is formed in the light-sensitive silver halide emulsion layer by the subsequent activating processing with an alkali solution, wherein the tanning developing developing agent is present in the light-sensitive silver halide emulsion layer in an amount of about 0.01 to 100 mmols per $1\mu$ thickness and square meter of the light-sensitive silver halide emulsion layer, and wherein the amounts of tanning developing agent and silver halide in the interlayer are less than the amounts thereof in the light-sensitive silver halide emulsion layer, (2) forming a tanned silver image by activation processing using an alkali solution, (3) washing off portions of the silver halide emulsion layer where no silver images have been formed to thereby leave tanning-hardened silver image portions on said light-sensitive resin composition layer, thus forming a hardened relief silver image, (4) uniformly irradiating with light to which said light-sensitive resin composition is sensitive, in an amount such that the light-sensitive resin composition layer in the areas where the relief silver image is not present will dissolve in an alkaline developer, and (5) developing the material with an alkaline developer capable of dissolving the light-sensitive resin composition layer in areas where the relief silver image does not exist to thereby form a relief image comprising the insoluble portions of the light-sensitive resin composition layer and the hardened relief silver image lying thereon.

12. The process of claim 11, wherein said a tannable interlayer contains a polymer the same as the binder polymer for the light-sensitive silver halide emulsion layer, wherein said washing off of step (3) removes the silver halide emulsion layer and the interlayer where no silver images have been formed to thereby leave tanning-hardened silver image portions and underlying interlayer on said light-sensitive resin composition layer.

13. The process of claims 11 or 12, wherein the alkaline developer for the light-sensitive resin layer is the same alkali solution as used for activating the silver halide emulsion layer.

14. The process of claim 13, wherein the alkali solution has a pH of about 9 to 14.

15. The process of claim 12, wherein following exposure and development of the light-sensitive material, said material is heated at 70° to 300° C.

16. The process of claim 12, wherein the alkaline developer is an aqueous solution of an alkaline material selected from the group consisting of sodium hydroxide, potassium hydroxide, lithium hydroxide, sodium phosphate, potassium phosphate, lithium phosphate, sodium carbonate, potassium carbonate, ammonium carbonate, sodium bicarbonate, and ammonia.

17. The process of claim 12, wherein the activation processing solution contains an antifogging agent.

18. The process of claim 12, wherein the tanning development is conducted at an activation processing temperature of about 5° to 40° C. for about 10 seconds to 10 minutes.

19. The process of claim 12, additionally comprising the steps of stopping the tanning development and fixing the silver halide emulsion layer prior to washing off the unexposed portions of the silver halide emulsion layer.

20. The process of claim 13, wherein said exposure is not by contact exposure.

21. A method of forming images which comprises printing with a plate processed as in claim 13 without removing the hardened silver image.

22. The light-sensitive material of claim 1, wherein said interlayer is a gelatin layer containing tanning developer.

23. The light-sensitive material of claim 1, wherein said interlayer is about 0.1 to about $1.5\mu$ thick.

* * * * *